(12) United States Patent
Hayashi et al.

(10) Patent No.: US 7,479,795 B2
(45) Date of Patent: Jan. 20, 2009

(54) TEMPERATURE CONTROL APPARATUS

(75) Inventors: Shintaro Hayashi, Yokohama (JP); Osamu Urakawa, Yokohama (JP); Mitsuo Koizumi, Fukushima (JP)

(73) Assignee: Daytona Control Co., Ltd., Kanagawa-ken (JP)

( * ) Notice: Subject to any disclaimer, the term of this patent is extended or adjusted under 35 U.S.C. 154(b) by 283 days.

(21) Appl. No.: 11/415,278

(22) Filed: May 2, 2006

(65) Prior Publication Data

US 2006/0244472 A1    Nov. 2, 2006

(30) Foreign Application Priority Data

May 2, 2005    (JP)   ............... 2005-134224

(51) Int. Cl.
     *G01R 31/02*    (2006.01)
(52) U.S. Cl. ..................................... 324/760
(58) Field of Classification Search ................. 324/760
See application file for complete search history.

(56) References Cited

U.S. PATENT DOCUMENTS

| | | | |
|---|---|---|---|
| 5,534,785 A * | 7/1996 | Yoshizaki et al. ........... 324/758 |
| 5,807,104 A * | 9/1998 | Ikeya et al. .................... 439/73 |
| 5,892,367 A | 4/1999 | Magee et al. |
| 6,144,215 A * | 11/2000 | Maxwell et al. ............. 324/765 |
| 6,445,203 B1 * | 9/2002 | Yamashita et al. ........... 324/760 |
| 2004/0070416 A1 * | 4/2004 | Saito et al. ................... 324/760 |
| 2004/0077200 A1 | 4/2004 | Ishikawa et al. |
| 2005/0287685 A1 | 12/2005 | McFadden |

FOREIGN PATENT DOCUMENTS

| | | |
|---|---|---|
| JP | 10-288646 A | 10/1998 |
| JP | 2003-028924 A | 1/2003 |
| WO | WO 2005050238 A1 * | 6/2005 |

\* cited by examiner

*Primary Examiner*—Ha Tran T Nguyen
*Assistant Examiner*—Roberto Velez
(74) *Attorney, Agent, or Firm*—Nixon & Vanderhye P.C.

(57) ABSTRACT

A temperature control apparatus includes a socket holder which is provided on a tester head and holds a socket to mount an IC chip. A socket cover has an opening to pass the end of a handler pusher for holding the IC chip on testing. The socket cover forms a closed space around the IC chip in a state that the IC chip is pressed to the socket by the pusher. A gas supplying unit externally supplies the closed space with gas of a predetermined temperature.

13 Claims, 9 Drawing Sheets

US 7,479,795 B2

TEMPERATURE CONTROL APPARATUS

CROSS-REFERENCE TO RELATED APPLICATIONS

This application is based upon and claims the benefit of priority from prior Japanese Patent Application No. 2005-134224, filed May 2, 2005, the entire contents of which are incorporated herein by reference.

BACKGROUND OF THE INVENTION

1. Field of the Invention

The present invention relates to a temperature control apparatus, and more particularly to a temperature control apparatus for holding a temperature of an IC chip to be tested by a handler at a predetermined temperature during the test.

2. Description of the Related Art

An IC chip has been used for the control of a consumer electric apparatus regardless of indoor and outdoor uses. A temperature condition for use of an IC chip extends over a wide range of −55° C. to +150° C. for example. An IC chip is checked for stable operation under such a temperature condition in the course of production and shipment. Therefore, a handler and a tester are used for testing an IC chip. For example, in a room temperature test, a socket is placed on a tester head at a room temperature, and an IC chip is placed on the socket. This test is performed by placing a room-temperature IC chip on a socket, and holding the IC chip to the socket by a pusher of a handler. However, the socket and pusher are influenced by the heat generated in the tester head and handler, and often heated to a temperature higher than a room temperature. Thus, the test is performed in a temperature condition higher than a room temperature. In a high-temperature test, IC chips are held at a predetermined high temperature by using a high-temperature bath provided in a handler, and a required number of IC chips is taken out, for example, one by one, and set on a socket. In this case, also, a socket is not set to a high temperature, and an IC chip is cooled by a socket immediately after being placed on the socket. As a result, an IC chip is tested at a temperature lower than a desired temperature.

Because of the above reason, an IC chip cannot be tested in a desired temperature condition. An IC chip not tested in a correct temperature condition is shipped, incorporated in an apparatus, and used. As a result, the quality of IC chip test is lowered, and the reliability of handler and tester is also lowered.

It is considerable to control a temperature in a tester head and handler to eliminate the influence to the temperature of an IC chip placed on a socket. However, it is necessary to modify largely a tester head or handler for this purpose. The modification cost is high, and increases the cost of IC chip test.

BRIEF SUMMARY OF THE INVENTION

According to an aspect of the present invention, there is provided a temperature control apparatus comprising a socket holder which is provided on a tester head and holds a socket to mount a test object IC chip, a socket cover which has an opening to pass the end of a handler pusher for holding the IC chip on testing, and forms a closed space around the IC chip in a state that the IC chip is pressed to the socket by the pusher, and a gas supplying unit which externally supplies the closed space with gas of a predetermined temperature.

According to the invention, there can be provided a temperature control apparatus, which can provide a test temperature environment suitable for an IC chip with ease and low cost while keeping test quality and reliability of the tester and/or handler by providing a correct test temperature environment.

DETAILED DESCRIPTION OF THE INVENTION

An embodiment of the invention will be explained in detail hereinafter with reference to the accompanying drawings.

Figure 1:
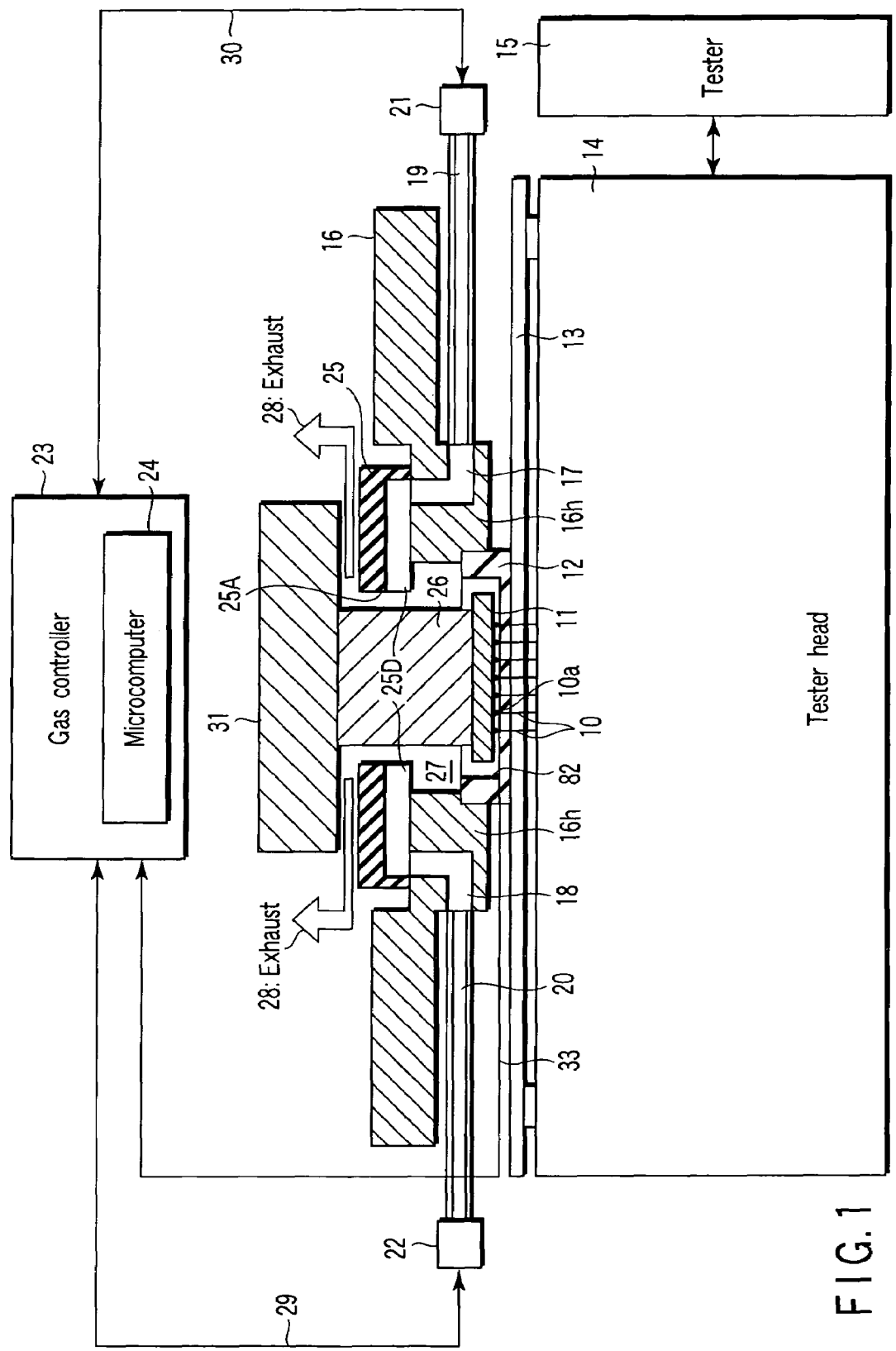
FIG. 1 is a block diagram showing the configuration of a first embodiment of the present invention.

FIG. 1 is a block diagram showing the configuration of a first embodiment of the invention. One IC chip is tested at one time in this embodiment, but the invention is applied also to a case that two or more IC chips are tested at the same time. In FIG. 1, a test object IC chip 11 having a contact 10a for connection is placed on a socket 12 and tested. The socket 12 is made of insulation material such as plastic, has a contact such as a solder ball connected in contacting with the contact 10a, and held on a tester head 14 through a performance board 13. The contact 10a of the IC chip 11 is electrically connected to the tester head 14 through the performance board 13 by a connector pin 10 connected to the contact of the socket 12. The tester head 14 is connected to a tester body 15, and controls its operation at the time of test.

On the performance board 13, a socket adapter plate 16 fixed by a not-shown fixing bolt is provided. A socket holder 16h is formed at the center of the socket adapter plate 16. Gas paths 17 and 18 are formed inside of the socket holder. The gas path 17 is connected to a gate of a high-temperature gas generation unit 19. The gas path 18 is connected to a gate of a low-temperature gas generation unit 20. The high-temperature gas generation unit 19 is electrically driven by a driver 21. The low-temperature gas generation unit 20 is electrically driven by a driver 22. The drivers 21 and 22 are connected to a gas controller 23 or a socket temperature control unit through cables 29 and 30, respectively. The operation of the whole gas controller 23 is controlled by a microcomputer 24 provided inside.

A socket chamber or space 27 for temperature setting described later is formed at the center of the socket holder 16h formed at the center of the socket adapter plate 16, and the bottom opening of the socket chamber is closed by the socket 12. The upper opening is closed by a socket cover 25 having an opening 25A having the diameter a little larger than that of the distal end of a pusher 26 of the handler. The space 27 for temperature setting is formed between the bottom opening and upper opening. Under the surface of the socket cover 25, a gas groove 25D is formed to flow gas in a space to the socket holder 16h. The socket cover 25 is positioned on the socket holder 16h, so that one end of the gas groove 25D is connected to the space 27 for temperature setting, and the other end is connected to the gas paths 17 and 18 formed in the socket holder 16h. The pusher 26 is fixed to the lower end of a pusher holder 31 thicker than the pusher 26, and moved up/down along the axis at the time of test. On the test, the IC chip 11 is pushed against the socket 11 by the pusher 26, and a clearance is made between the lower side of the pusher holder 31 and the upper side of the socket cover 25. Temperature gas discharged to the space 27 for temperature setting through the gas groove 25D, for example, air set to a prescribed temperature is discharged to the outside of the handler through this clearance, and exhausted through the gas path 17 or 18. Instead of the air, inert gas including no humidity may be used. As explained later in detail, for example, when the high-temperature gas generation unit 19 is driven by the driver 21, the low-temperature gas generation unit 20 is not driven. Therefore, high-temperature gas, for example, hot air is pressed from the gas path 17 into the temperature setting space 27 through the gas groove 25D, and exhausted from the other gas groove 25D through the gas path 18 and low-temperature gas generation unit 20. Contrarily, when the low-temperature gas generation unit 20 is driven, the high-temperature gas generation unit 19 acts as an exhausting path.

Figure 2:
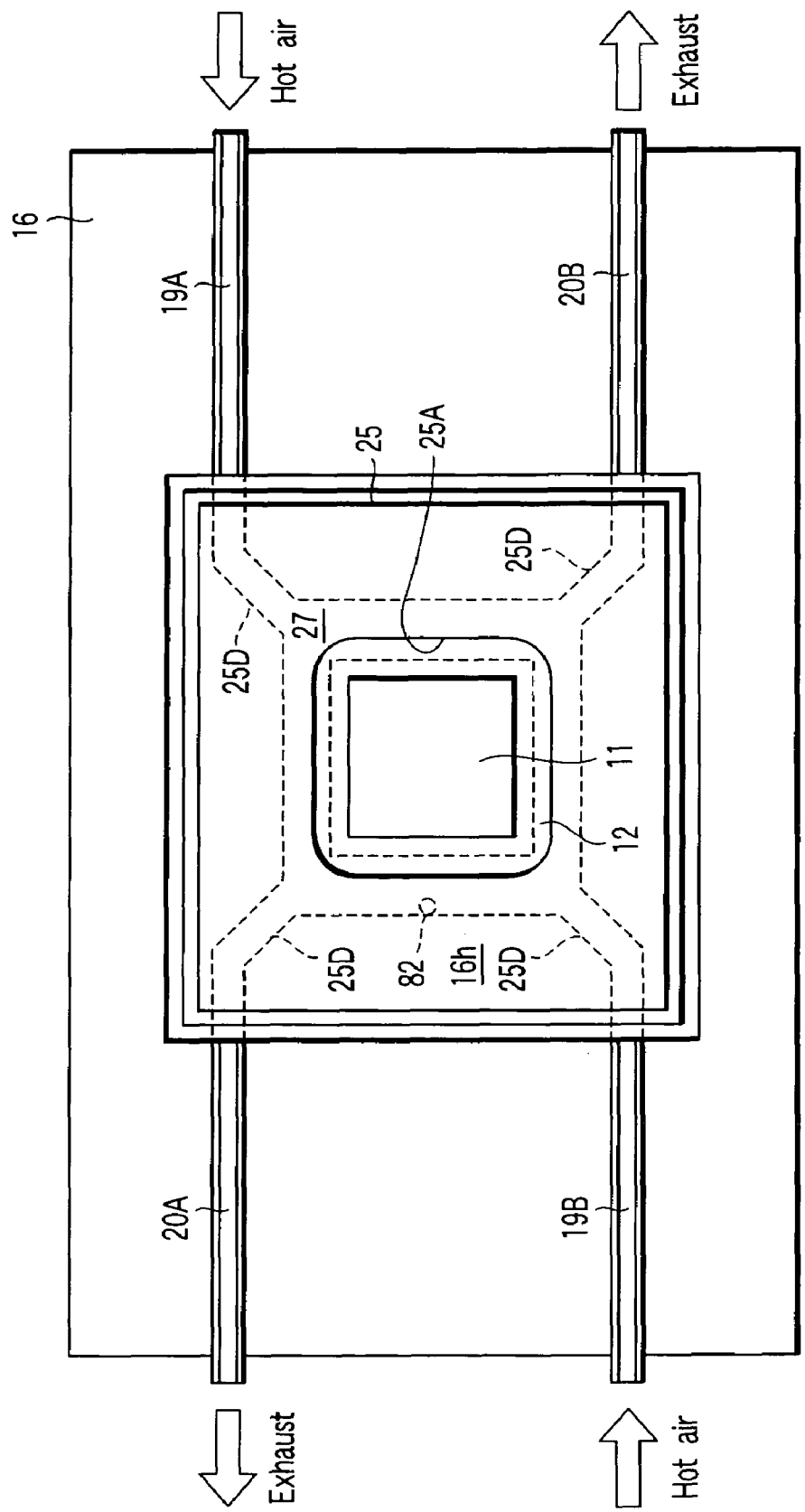
FIG. 2 is a plan view of a socket adapter plate for explaining the operations of the embodiment shown in FIG. 1.

The high-temperature gas generation unit 19 and low-temperature gas generation unit 20 shown in FIG. 1 are provided as a pair in the socket adapter plate 16 as shown in FIG. 2. Namely, in FIG. 2, a substantially square space 27 for temperature setting is formed at the center of the socket holder 16h formed at the center of the socket adapter plate 16. At two opposed corners along the diagonal line of the square space, the gas groove 25D connected to a pair of high-temperature gas generation units 19A and 19B is formed. On the other diagonal line rotated 90° against the diagonal line, another gas groove 25D connected to a pair of low-temperature gas generation units 20A and 20B is formed. On the other diagonal line rotated 90° against the diagonal line, another gas groove 25D connected to a pair of low-temperature gas generation unit 20A and 20B is formed.

The socket cover 25 having the opening 25A is placed on the socket adapter plate 16 just like covering the upper part of the four gas grooves 25D and temperature setting space 27. The opening 25A has the dimension larger than the outside dimensions of the IC chip 11 and pusher 26 plated on the socket 12. The pusher 26 is inserted into the opening 25A, as shown in FIG. 1.

Explanation will be given on the operation of the embodiment of FIG. 1 hereinafter with reference to FIG. 2, FIG. 3 and FIG. 8.

When testing the IC chip 11 at a temperature of 150° C., for example, first place the socket cover 25 on the socket adapter plate 16 and form the temperature setting space 27. Then, operate the handler, and place the IC chip 11 on the socket 12 through the opening 25A. Lower the pusher 26 and push the IC chip 11 to the socket 12. Otherwise, press the IC chip 11 to the socket 12 in the state that the IC chip is held or vacuum-sucked at the distal end of the pusher 26.

Figure 4:
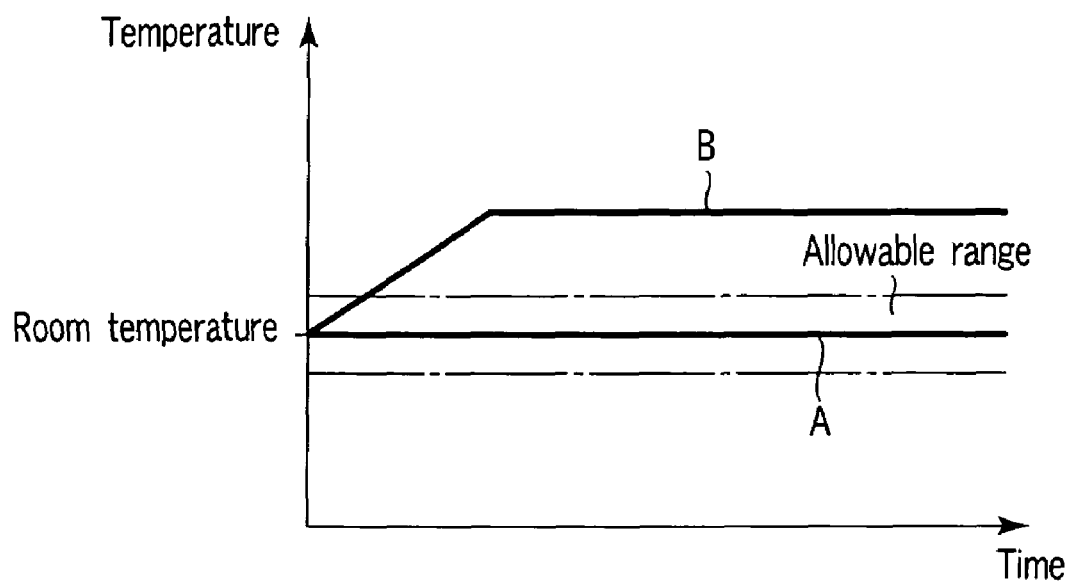
FIG. 4 is a chart for explaining the temperature control operations of FIG. 1.
Figure 8:
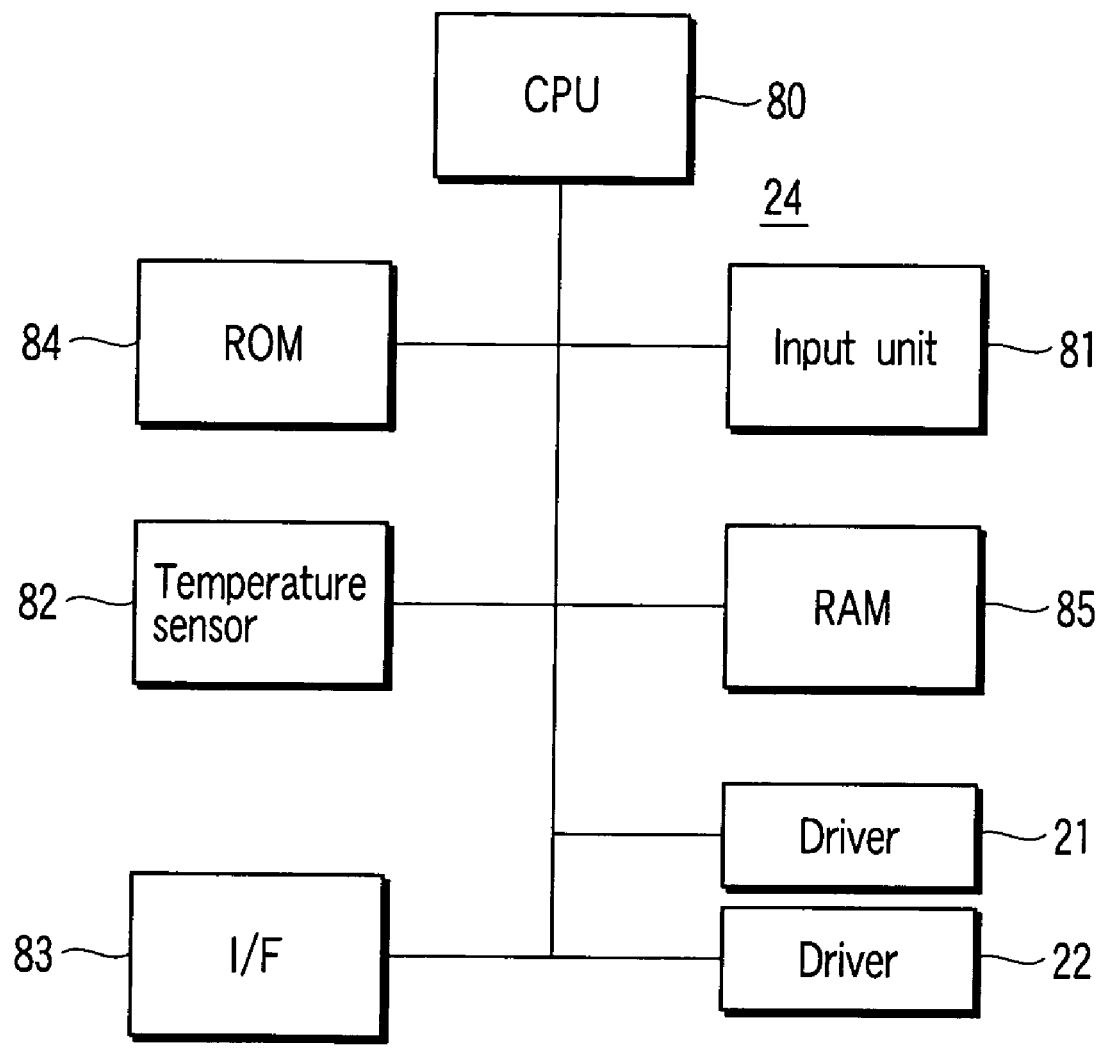
FIG. 8 is a block diagram showing the configuration of a temperature gas generation unit including a microcomputer shown in FIG. 1.

In this state, input a test setting of a high temperature 150° C., for example, by using an input unit such as a keyboard connected to a CPU 80 of a microcomputer 24 provided in the gas controller 23 (corresponding to the input unit 81 in FIG. 8). A temperature sensor 82 is provided inside the space 27 of the socket 12 in FIG. 1. A temperature signal in the socket 12 is detected by the temperature sensor, and sent to the CPU 80 of FIG. 8 through a line 33, and detected. The CPU 80 compares the temperature data of the sensor 82 with the set temperature of 150° C. inputted into the input unit 81, and when the temperature data of the sensor 82 is lower than 150° C., sends a drive signal to the driver 21, makes the high-temperature gas generation units 19A and 19B of FIG. 2 generate a high-temperature gas of 150° C., presses to send a high-temperature gas of 150° C. into the temperature setting space 27 through the gas groove 25D, and heats the IC chip 11. In this case, the high-temperature gas is extremely stirred in the space 27, and the space 27 is substantially uniformly heated. The gas lowered in temperature by this heating is exhausted from the other gas groove 25D to the outside through the unused low-temperature gas generation units 20A and 20B. The heat of the IC chip is partially escaped through the socket 12 and pusher 26, but as the IC chip is heated by the high-temperature gas, the IC chip is heated to 150° C. in short time, and a 150° C. detection signal is sent from the sensor 82 to the CPU 80. As a result, as shown in FIG. 4, the IC chip 11 is held constant in a range of ±3° C. of an allowable range, for example, a set high temperature A° C. Therefore, a sudden temperature drop immediately after placing on a socket, as shown by a prior art temperature curve B, does not occur. When detecting the high temperature state, the CPU 80 sends the tester 15 a high temperature setting complete state signal through a not-shown communication path through an interface 83, for example, and starts the high temperature test. The CPU 80 is set by program stored in a ROM 84 to execute preset operations, and the data obtained by the operations is stored in a RAM 85 as necessary.

Figure 5:
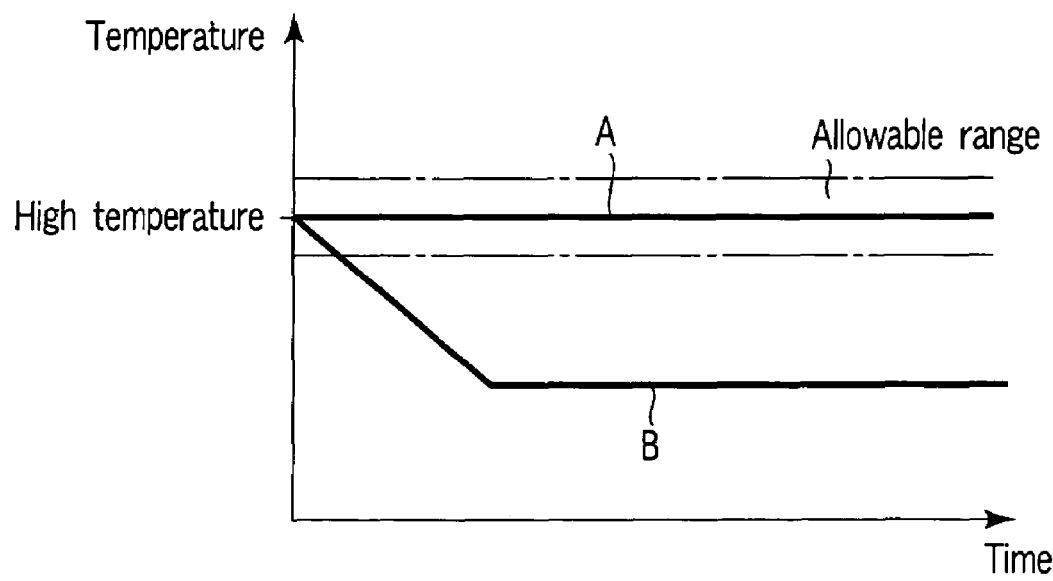
FIG. 5 is a chart for explaining the temperature control operations of FIG. 1.

Now, explanation will be given on the case that the IC chip 11 is set to a room temperature A and the temperature is kept within an allowable range as shown in FIG. 5, with reference to FIG. 3. In this case, temperature data designating a temperature lower than the room temperature of 25° C. for example 0° C. is input from the input unit 81 shown in FIG. 8. In this state, the socket cover 25 is placed on the socket adapter plate 16, and then the IC chip 11 is pushed to the socket 12 by the pusher 26. The sensor 82 is influenced by a temperature higher than the room temperature transmitted from the tester head 14 and pusher 26, and detects this temperature higher than the room temperature. Thus, the CPU 80 detects the difference between the set temperature 25° C. and the temperature detected by the sensor 82, drives the low temperature gas generation driver 22, generates gas of 0° C. from the low-temperature gas generation units 20A and 20B, and sends the gas to the temperature setting space 27. The temperature in the space 27 is lowered by this, and when the sensor 82 detects a temperature a little lower than the room temperature, the CPU 80 sends the tester 15 a start OK signal through the interface 83. In this case, the IC chip 11 always receives heat from the socket 12 or pusher 26, and when the sensor 82 detects the room temperature 25° C. the temperature of the IC chip 11 may be a little higher than the detected temperature. Therefore, when the sensor 82 indicates a value a little lower than 25° C., it is judged that the IC chip 11 is near the room temperature. The difference between the temperature detected by the sensor 82 and the actual temperature of the IC chip 11 is previously examined statistically and stored in the ROM 84 as data, and the data may be read by the CPU

80. In this way, as shown in FIG. 5, the IC chip 11 is held near the room temperature or the temperature A within an allowable range, and not heated as indicated by the prior art curve B by receiving the heat from the socket or pusher.

Figure 3:
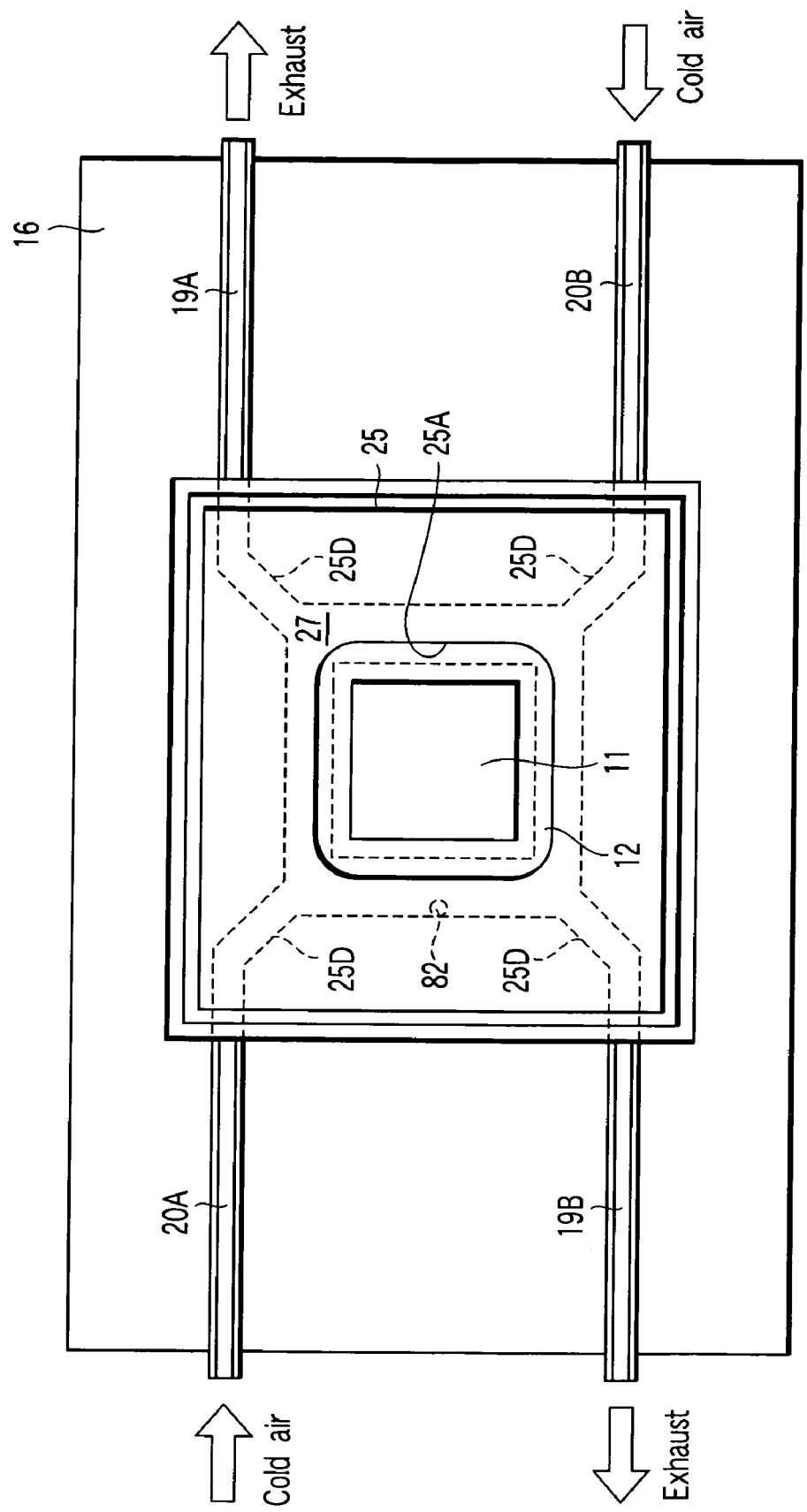
FIG. 3 is a plan view of a socket adapter plate for explaining the operations of the embodiment shown in FIG. 1.

Even for the low temperature test of the IC chip 11 at −5° C., for example, a gas of a temperature a little lower than −5° C. is generated by the temperature gas generation units 20A and 20B as shown in FIG. 3, and the gas may be supplied to the temperature setting space 27. The sensor 82 detects the temperature of the space 27. When the difference between the detected temperature and the actual temperature of the IC chip 11 is examined and stored in a memory table previously, the actual temperature of the IC chip 11 can be easily known from the memory table using the output data from the sensor 82.

Figure 6:
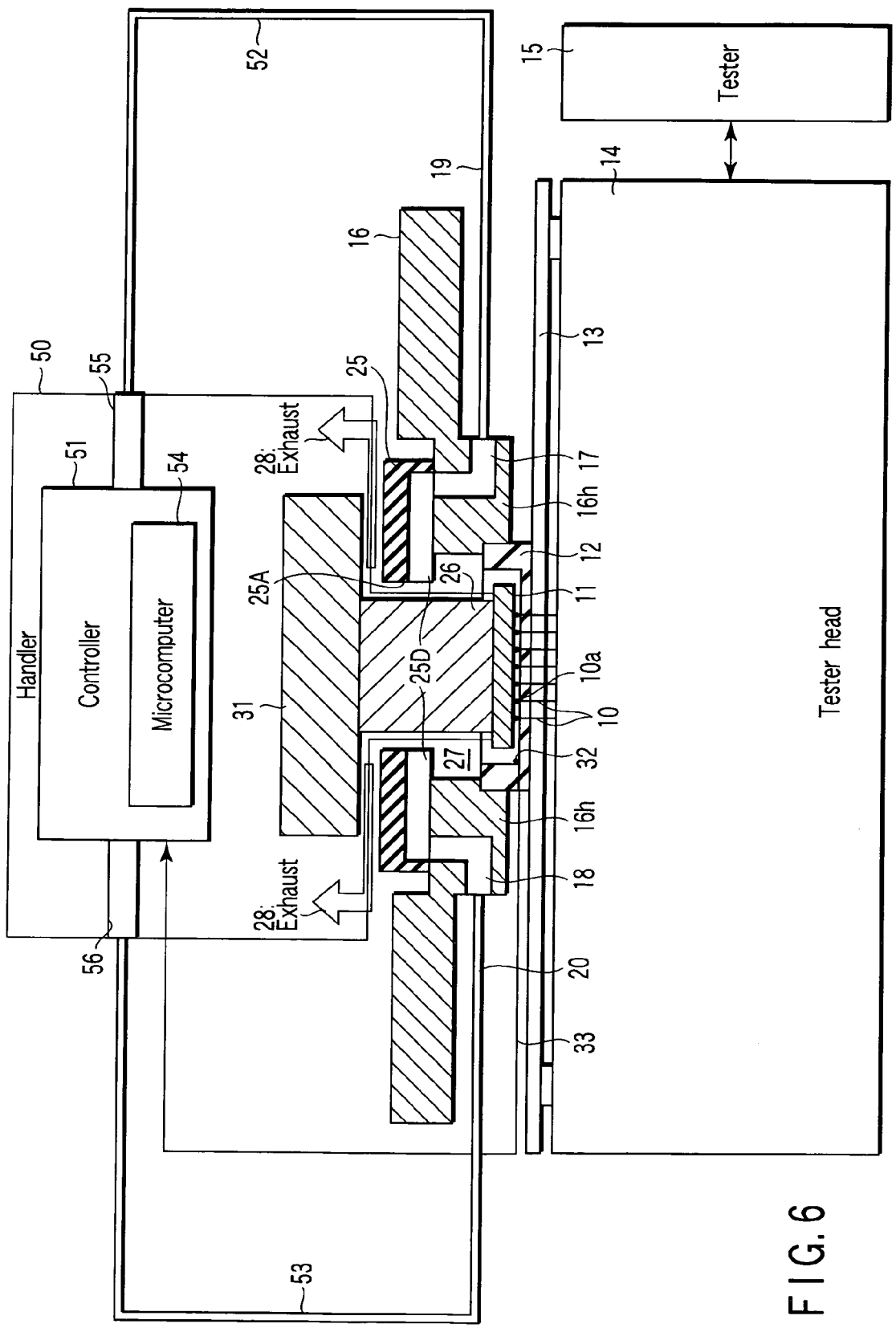
FIG. 6 is a block diagram showing the configuration of another embodiment of the invention.

In the embodiment shown in FIG. 1, the gas controller 23 is provided independently of a handler or a tester 15. In another aspect of the present invention, the gas controller 23 may be incorporated in a handler. FIG. 6 is a block diagram showing the configuration of another embodiment of the invention based on this idea. In this case, in addition to a controller 51 and a microcomputer 54, a handler 50 contains a high-temperature gas generation unit 55 and a low-temperature gas generation unit 56 for the temperature gas test of the IC chip 11. The high-temperature gas generation unit 55 and the low-temperature gas generation unit 56 correspond to the high-temperature gas generation unit 19 and driver 21 and the low-temperature gas generation unit 20 and driver 22 shown in FIG. 1, respectively. The gas generated from the high-temperature gas generation unit 55 and low-temperature gas generation unit 56 is urged to send to the gas paths 17 and 18 formed in the socket holder 16h of the socket adapter plate 16 through gas pipes 52 and 53, respectively. The other components of the embodiment of FIG. 6 are the same as the embodiment of FIG. 1. The components are given with the same reference numerals, and explanation will be omitted. The microcomputer 54 provided in the controller 51 of FIG. 6 has the similar configuration as that shown in FIG. 8, and performs the similar function as the embodiment of FIG. 1 in the temperature test of the IC chip 11. However, if the controller 51 has a not-shown computer for controlling whole operations of the handler 50, the computer may of course be configured to perform the function of the microcomputer 54 instead of the microcomputer 54. In this case, the temperature control of the IC chip 11 on the temperature test by high-temperature gas and low-temperature gas may be the same as in the embodiment of FIG. 1, and detailed explanation will be omitted.

Figure 7:
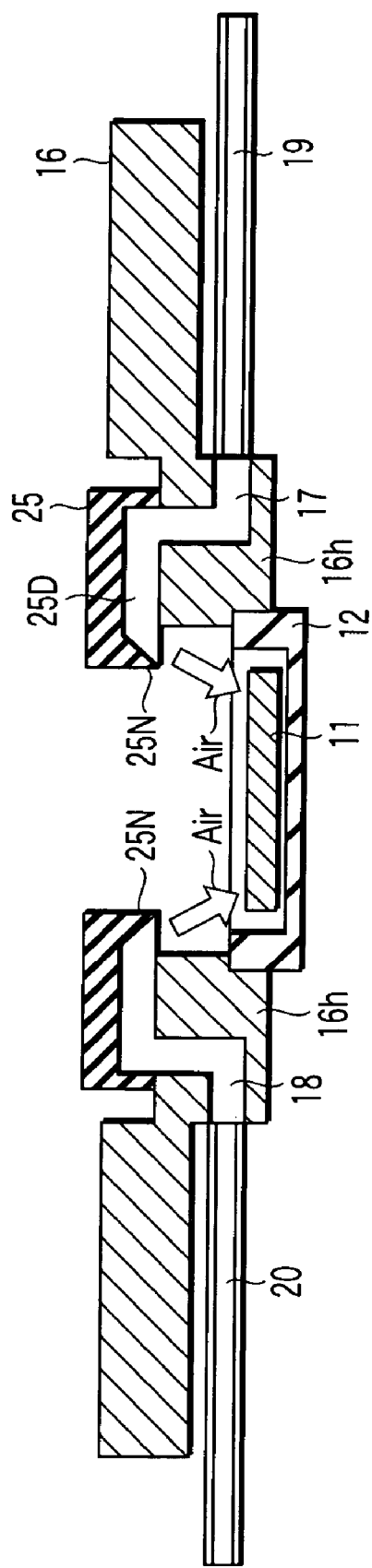
FIG. 7 is a sectional view showing the essential part of still another embodiment of the invention.

In the embodiment of FIG. 1, the gas set to a predetermined temperature is blown from outlets of the gas paths 17 and 18 to the side of the pusher 26 through the gas groove 25D, and supplied to the temperature setting space 27 in this state. Further, if the temperature test gas is blown directly to the IC chip 11, the temperature of the IC chip 11 can be more quickly set close to the gas temperature. FIG. 7 is a sectional view of the essential part of an embodiment showing an example, with a downward nozzle 25N formed at the distal end of the gas groove 25D formed under the socket cover 25. With this structure, by blowing hot air or cold air directly to the IC chip 11, the temperature of the IC chip can be set efficiently in a short time.

Figure 9:
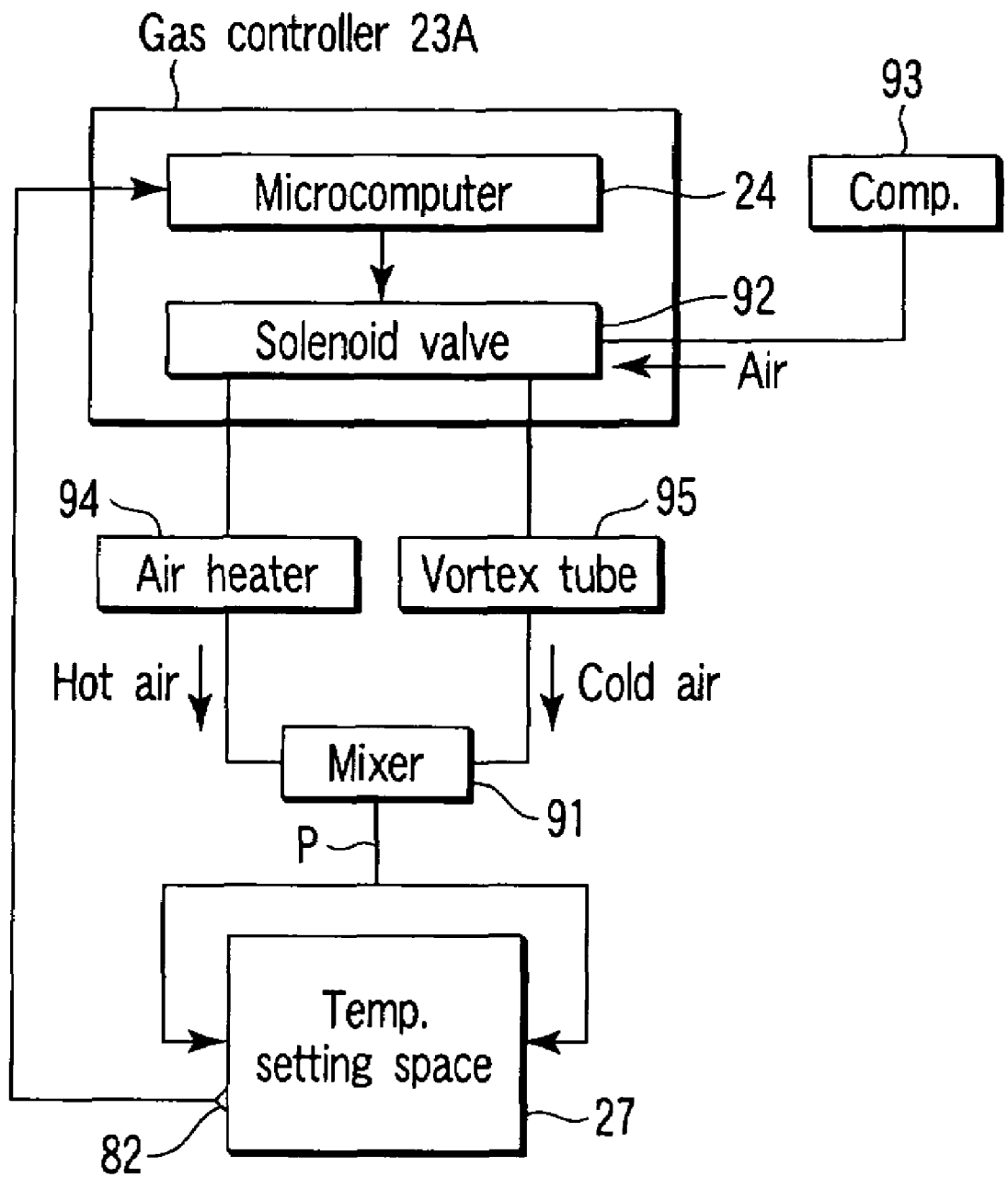
FIG. 9 is a block diagram showing the configuration of a still further embodiment of the invention.

FIG. 9 is a block diagram showing the configuration of a still further embodiment of the invention. In the embodiment of FIG. 1, high-temperature air and low-temperature air are fed to the temperature setting space 27 formed in relation to the socket 12 from the high-temperature gas generation unit 19 and the low-temperature gas generator unit 20, respectively, and the high-temperature air and the low-temperature air are mixed inside the space 27 to form air of a desired temperature. In the embodiment of FIG. 9, it is configured in such a manner that high-temperature air and low-temperature air are sent to a mixer 91 and mixed therein, and the mixed air is then fed to the space 27. By pre-mixing air before feeding into the space 27 in this way, it is possible to form air still more free of temperature irregularities than that in the embodiment of FIG. 1 can be formed in the space 27, and temperature setting of IC chips can be carried out more accurately.

In the embodiment of FIG. 9, a configuration is made in such a manner that a solenoid valve mechanism 92 is provided in a gas controller 23A, room-temperature air fed from an external compressor 93 to the solenoid valve mechanism 92 is fed to an air heater 94 which is a high-temperature gas generation unit and a vortex tube 95 which is a low-temperature gas generation unit at a predetermined ratio under the control of the microcomputer 24, and hot air and cold air generated, respectively, are sent to the mixer 91. The microcomputer 24 receives output data from the temperature sensor 82 and carries out temperature control of air in the space 27 in accordance with a predetermined programming in the same manner as in the embodiment of FIG. 1. In this case, air delivered from the mixer 91 and set to a desired temperature may be supplied to inlets of the gas paths 17 and 18 formed in the socket adapter plate 16 of FIG. 1.

Figure 10A:
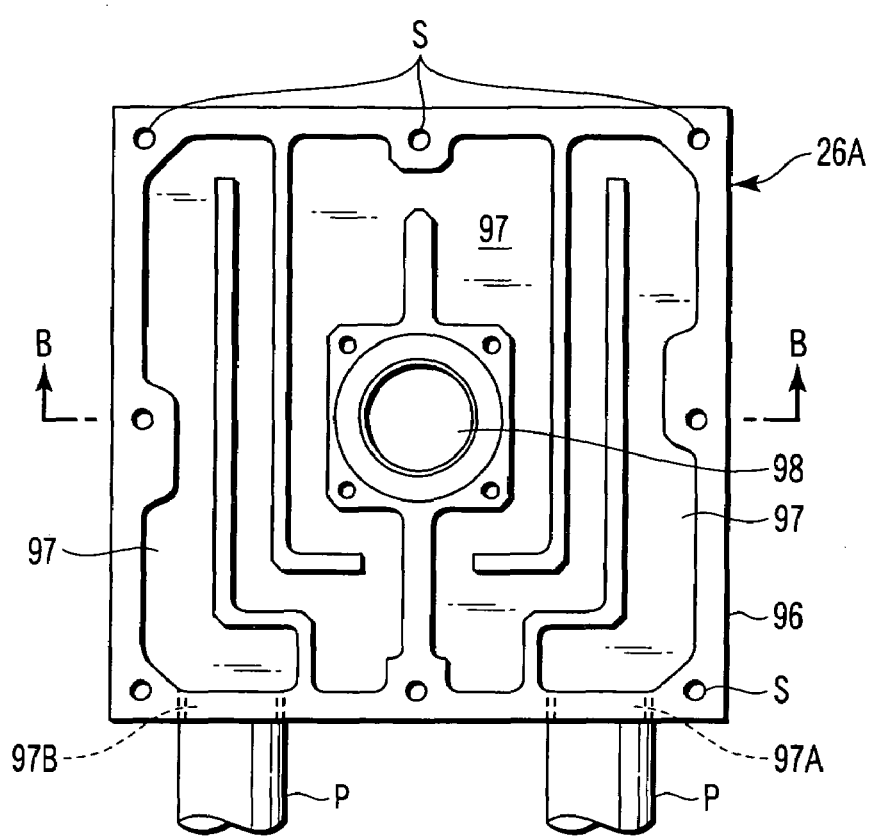
FIG. 10A is a plan view showing the internal configuration of a socket unit in a temperature setting space shown in FIG. 9.
Figure 10B:
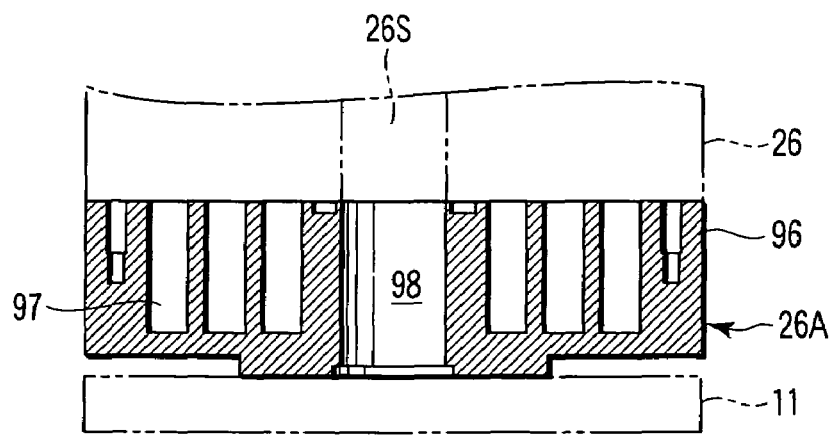
FIG. 10B is a sectional view showing a gas path in the socket unit shown in FIG. 10A.

Now, the temperature setting space 27 in the embodiment shown in FIG. 9 is configured around the pusher 26 shown in FIG. 1 or FIG. 6. Furthermore, the temperature setting space 27 can be used in combination with a pusher end portion 26A configured as shown in FIGS. 10A and 10B. The pusher end portion 26A has a housing 96 which is fixed to, for example, the end of the pusher 26 shown in FIG. 1 by a screw S, and an air groove 97 and a suction hole 98 are formed inside the housing 96. The air groove 97 communicates with an air outlet of the mixer 91 shown in FIG. 9 via a pipe P connected to either one of two apertures 97A and 97B. The other aperture communicates with the atmosphere and is used for an exhaust port. The suction hole 98 is used to hold the IC chip 11 at its opening and is allowed to communicate with a not-shown vacuum device via a suction path 26S formed through the pusher 26 inside. The housing 96 is formed with metal with good heat conductivity such as, for example, aluminum, and easily assimilates with the temperature of air introduced inside the air grove 97, so that the IC chip 11 held at the opening of the suction hole 98 is quickly set to the temperature equal to that of the air introduced.

Now, in the case where the pusher end portion 26A shown in FIG. 10A is mounted to the end of the pusher 26 and used for testing IC chips, the pusher end portion 26A is vertically moved integrally with the pusher 26. For this reason, the pipe P is made of a flexible material such as, for example, rubber in order to flexibly link the interval with the fixed mixer 91. The configuration other than this is the same as that of the embodiment shown in FIG. 1, and further description will be omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A temperature control apparatus comprising:
   a socket holder which is provided on a tester head and holds a socket to mount a test object IC chip, the socket holder including a substantially square space formed therein around the IC chip held on the socket and at least two gas grooves formed at two opposed corners along a diagonal line of the square space;

a socket cover mounted on the socket holder and having an opening to pass the end of a handler pusher for holding the IC chip on the socket on testing, to close the space formed around the IC chip in a state that the IC chip is pressed to the socket by the pusher; and a gas supplying unit which externally supplies the space with gas of a predetermined temperature through the two gas grooves.

2. The temperature control apparatus according to claim 1, wherein the gas supplying unit has a means for setting a predetermined gas temperature, a means for generating the gas set at the predetermined temperature, a means for pressing the gas to send to the space, and a means for controlling the gas generating means to make the temperature in the space have a specific relation with the predetermined temperature.

3. A temperature control apparatus comprising: a socket holder which is provided on a tester head and holds a socket to mount a test object IC chip, the socket holder including a substantially square space formed therein around the IC chip held on the socket and four gas grooves formed at four corners of the space, two of the four gas grooves formed at two opposed corners along a diagonal line of the square space being connected to a gas supplying unit, and the other two of the four grooves acting as exhaust paths; a socket cover mounted on the socket holder and having an opening to pass the end of a handler pusher for holding the IC chip on the socket on testing, to close the space formed around the IC chip in a state that the IC chip is pressed to the socket by the pusher; and wherein the gas supplying unit externally supplies the space with gas of a predetermined temperature through the two gas grooves not acting as exhaust paths.

4. The temperature control apparatus according to claim 2, wherein the gas supplying unit is provided in association with the handler.

5. The temperature control apparatus according to claim 2, wherein the gas supplying unit further includes a nozzle for blowing the gas into the space to stir the air in the space.

6. The temperature control apparatus according to claim 2, wherein the gas supplying unit further includes a vortex tube which feeds cold air.

7. The temperature control apparatus according to claim 1, wherein the gas supplying unit is provided independently of the handler.

8. The temperature control apparatus according to claim 1, wherein the gas supplying unit is provided in association with the handler.

9. The temperature control apparatus according to claim 1, wherein the socket holder has a lower opening and an upper opening, and the space is formed by closing the lower opening by the socket and the upper opening by the socket cover.

10. The temperature control apparatus according to claim 1, wherein the gas supplying unit comprises: an air compressor; a temperature detection element which detects temperature inside the space; a solenoid valve to control a flow rate of air from the compressor; a control unit including a microcomputer which controls the opening of the solenoid valve in accordance with an output of the temperature detection element; a gas generating unit including a cooling unit which cools air from the solenoid valve and a heating unit which heats the air; and an air feeding unit including a mixer which mixes the generated gas and sends the mixed gas to the space.

11. A temperature control apparatus comprising: a socket holder which is provided on a tester head and holds a socket to mount a test object IC chip, the socket holder including a substantially square space formed therein around the IC chip held on the socket and four gas grooves formed at four corers of the space, two of the four gas grooves formed at two opposed corners along a diagonal line of the square space being connected to a gas supplying unit, and the other two of the four gas grooves acting as exhaust oaths; a socket cover mounted on the socket holder and having an opening to pass the end of a handler pusher for holding the IC chip on the socket on testing, to close the space formed around the IC chip in a state that the IC chip is pressed to the socket by the pusher; wherein the gas supplying unit externally supplies the closed space with gas of a predetermined temperature; and a pusher end portion which is mounted to an end of the pusher and has a gas groove through which the gas from the gas supplying unit passes; and a suction hole which absorbs the IC chip.

12. The temperature control apparatus according to claim 11, wherein the gas supplying unit comprises: an air compressor; a temperature detection element which detects temperature inside the space; a solenoid valve to control a flow rate of air from the compressor; a control unit including a microcomputer which controls the opening of the solenoid valve in accordance with an output of the temperature detection element; a gas generating unit including a cooling unit which cools air from the solenoid valve and a heating unit which heats the air; and an air feeding unit including a mixer which mixes the generated gas and sends the mixed air to the gas groove at the pusher end portion.

13. The temperature control apparatus according to claim 12, wherein the gas supplying unit includes a vortex tube which feeds cold air.

* * * * *